United States Patent
Kunz

(10) Patent No.: US 9,196,280 B2
(45) Date of Patent: Nov. 24, 2015

(54) LOW-FIELD MAGNETIC DOMAIN WALL INJECTION PAD AND HIGH-DENSITY STORAGE WIRE

(75) Inventor: Andrew Kunz, Wauwatosa, WI (US)

(73) Assignee: Marquette University, Milwaukee, WI (US)

(*) Notice: Subject to any disclaimer, the term of this patent is extended or adjusted under 35 U.S.C. 154(b) by 567 days.

(21) Appl. No.: 12/945,127

(22) Filed: Nov. 12, 2010

(65) Prior Publication Data

US 2011/0111259 A1    May 12, 2011

Related U.S. Application Data

(60) Provisional application No. 61/281,039, filed on Nov. 12, 2009.

(51) Int. Cl.
| | | |
|---|---|---|
| B32B 15/04 | (2006.01) | |
| G11B 5/33 | (2006.01) | |
| G11B 5/64 | (2006.01) | |
| B82Y 10/00 | (2011.01) | |
| B82Y 25/00 | (2011.01) | |
| G11C 11/14 | (2006.01) | |
| G11C 19/08 | (2006.01) | |

(52) U.S. Cl.
CPC ............... G11B 5/642 (2013.01); B82Y 10/00 (2013.01); B82Y 25/00 (2013.01); G11C 11/14 (2013.01); G11C 19/0808 (2013.01); G11C 19/0816 (2013.01); *Y10T 428/32* (2015.01); *Y10T 428/325* (2015.01)

(58) Field of Classification Search
None
See application file for complete search history.

(56) References Cited

U.S. PATENT DOCUMENTS

| | | |
|---|---|---|
| 6,614,084 B1 | 9/2003 | Cowburn et al. |
| 6,774,391 B1 | 8/2004 | Cowburn |
| 6,834,005 B1 | 12/2004 | Parkin |
| 6,867,988 B2 | 3/2005 | Cowburn |
| 6,898,132 B2 | 5/2005 | Parkin |
| 6,920,062 B2 | 7/2005 | Parkin |
| 6,970,379 B2 | 11/2005 | Parkin |
| 7,031,178 B2 | 4/2006 | Parkin |
| 7,236,386 B2 | 6/2007 | Parkin |
| 7,315,470 B2 | 1/2008 | Parkin |
| 7,492,622 B2 | 2/2009 | Parkin et al. |
| 7,502,244 B2 | 3/2009 | Cowburn |
| 7,551,469 B1 | 6/2009 | Parkin |
| 7,554,835 B2 | 6/2009 | Cowburn et al. |
| 7,626,844 B1 | 12/2009 | Moriya et al. |

(Continued)

OTHER PUBLICATIONS

Shigeto et al., "Magnetization switching of a magnetic wire with trilayer structure using giant magnetoresistance effect", Journal of Applied Physics, 2000, 88(11): 6636-6644.*

(Continued)

*Primary Examiner* — Holly Rickman
*Assistant Examiner* — Lisa Chau
(74) *Attorney, Agent, or Firm* — Andrus Intellectual Property Law, LLP

(57) ABSTRACT

Disclosed herein are magnetic storage devices and uses therefore. The devices comprise an injection pad and a nanowire extending from an outer edge of the injection pad. The injection pad and the nanowire of the disclosed magnetic storage devices have a geometry that is designed to optimize high density memory storage via low magnetic field domain wall shifting. The devices may be utilized, for example, for generating and storing magnetic domain walls for application in memory devices, sensor devices, and logic devices.

14 Claims, 12 Drawing Sheets

(56) References Cited

U.S. PATENT DOCUMENTS

| | | | |
|---|---|---|---|
| 7,667,994 | B1 | 2/2010 | Moriya et al. |
| 7,710,769 | B2 | 5/2010 | Cowburn et al. |
| 7,710,770 | B2 | 5/2010 | Cowburn et al. |

OTHER PUBLICATIONS

McMichael et al., "Head to head domain wall structures in thin magnetic strips", IEEE Transaction on Magnetics, Sep. 1997, 33(5): 4167-4769.*

Thomas et al., "Observation of injection and pinning of domain walls in magnetic nanowires using photoemission electron microcopy", Applied Physics Letters, 2005, 87:262501-1-262501-3.*

Kunz et al., "Dependence of domain wall structure for low field injection into magnetic nanowires", Applied Physics letter, 2009, 94: 192504-1 to 192504-3.*

O'Shea et al., "Direct observation of changes to domain wall structures in magnetic nanowires of varying width", Applied Physics Letters, 2008, 93: 202505-1-202505-3.*

Bryan et al. "Imaging of Magnetic DW Injection Processed in Patterned Ni80Fe20 Structures." N. p., 2009. Web.*

Allwood et al., "Magnetic Domain-Wall Logic", Science, 2005, 309:1688-1692.

Atkinson et al., "Controlling domain wall pinning in planar nanowires by selecting domain wall type and its application in a memory concept", Applied Physics Letters, 2008, 92:022510-1-022510-3.

Bogart et al., "Dependence of domain wall pinning potential landscapes on domain wall chirality and pinning site geometry in planar nanowires", Physical Review, 2009, pp. 054414-1-054414-8.

Bryan et al., "Transverse Field-Induced Nucleation Pad Switching Modes During Domain Wall Injection", IEEE Transactions on Magnetics, Apr. 2010, 46(4):963-967.

Cho, "At Mixed Odds, Racetrack Memory Charges From Gate", Science, Apr. 11, 2008, 320:166.

Faulkner et al., "Tuning of biased domain wall depinning fields at Permalloy nanoconstrictions", Journal of Applied Physics, 2008, 103:073914-1-073914-4.

Hayashi et al., "Dependence of Current and Field Driven Depinning of Domain Walls on Their Structure and Chirality in Permalloy Nanowires", Physical Review Letters, 2006, 97:207205-1-207205-4.

Hayashi et al., "Current-Controlled Magnetic Domain-Wall Nanowire Shift Register", Science, 2008, 320:209-211.

Kunz, "Improved magnetic domain-wall control with transverse fields", SPIE Newsroom, 2010, 1-2.

Kunz, "Simulated domain wall dynamics in magnetic nanowires", Journal of Applied Physics, 2006, 99:08G107-1-08G107-3.

Kunz et al., "Fast domain wall motion in nanostripes with out-of-plane fields", Applied Physics Letters, 2008, 93:082503-1-082503-3.

Kunz et al., "Enhancing domain wall speed in nanowires with transverse magnetic fields", Journal of Applied Physics, 2008, 103:07D903-1-07D903-3.

Kunz, "Field induced domain wall collisions in thin magnetic nanowires", Applied Physics Letters, 2009, 94:132502-1-132502-3.

Kunz et al., "Dependence of domain wall structure for low field injection into magnetic nanowires", Applied Physics Letters, 2009, 94:192504-1-192504-3.

Kunz et al., "Dynamic Notch Pinning Fields for Domain Walls in Ferromagnetic Nanowires", IEEE Transactions on magnetics, Jun. 2010, 46(6)1559-1561.

Lee et al., "Dynamic transformations of the internal structure of a moving domain wall in magnetic nanostripes", Physical Review B, 2007, 76:184408-1-184408-8.

Lewis et al., "Measuring Domain Wall Fidelity Lengths Using a Chirality Filter", Physical Review Letters, 2009, 102:057209-1-057209-4.

McGrouther et al., "Controlled domain wall injection into ferromagnetic nanowires from an optimized pad geometry", Applied Physics Letters, 2007, 91:022506-1-022506-3.

McMichael et al., "Head to head domain wall structures in thin magnetic strips", IEEE Transaction on Magnetics, Sep. 1997, 33(5):4167-4169.

O'Brien et al., "Near-field interaction between domain walls in adjacent Permalloy nanowires", PACS Numbers, Mar. 6, 2009, pp. 1-5.

Parkin et al., "Magnetic Domain-Wall Racetrack Memory", Science, Apr. 11, 2007, 320:190-194.

Petit et al., "Domain wall pinning and potential landscapes created by constrictions and protrusions in ferromagnetic nanowires", Journal of Applied Physics, 2008, 103:114307-1-114307-6.

Schryer et al., "The motion of 180° domain walls in uniform dc magnetic fields, Journal of Applied Physics", Dec. 1974, 45(12):5406-5421.

Strukov et al., "The missing memristor found", Nature, May 2008, 453:80-83.

Tanigawa et al., "Dynamical Pinning of a Domain Wall in a Magnetic Nanowire Induced by Walker Breakdown", Physical Review Letters, 2008, 101:207203-1-207203-3.

Tchernyshyov et al., "Fractional Vortices and Composite Domain Walls in Flat Nanomagnets", Physical Review Letters, 2005, 95:197204-1-197204-4.

Thomas et al., "Observation of injection and pinning of domain walls in magnetic nanowires using photoemission electron microscopy", Applied Physics Letters, 2005, 87:262501-1-262501-3.

Vanhaverbeke et al., "Control of Domain Wall Polarity by Current Pulses", Physical Review Letters, 2008, 101:107202-1-107202-4.

Weerts et al., "Influence of pulse amplitude and rise time on field-induced domain wall propagation in Ni80Fe20 nanowires", Journal of Applied Physics, 2008, 103:094307-1-094307-4.

Williams et al., "How We Found the Missing Memristor; Semiconductors/Processors", Dec. 2008, pp. 1-8.

* cited by examiner

LOW-FIELD MAGNETIC DOMAIN WALL INJECTION PAD AND HIGH-DENSITY STORAGE WIRE

CROSS-REFERENCE TO RELATED APPLICATIONS

The present application claims the benefit under 35 U.S.C. §119(e) to U.S. Provisional Application No. 61/281,039, filed on Nov. 12, 2009, the contents of which are incorporated herein by reference.

STATEMENT REGARDING FEDERALLY SPONSORED RESEARCH OR DEVELOPMENT

This invention was made with government support under Grant No. DMR-0706194 awarded by the National Science Foundation. The government has certain rights in the invention.

BACKGROUND

The field of the present invention relates to magnetic storage devices and the use thereof in applications including memory systems, sensor systems, and logic systems.

There are two main means of storing digital information for computing applications: solid-state random access memories (RAMs) and magnetic hard disk drives (HDDs). Magnetic domains are the main scientific principle behind all magnetic storage ranging from the identification coded on credit cards, data on computer hard drives, and informations on storage servers. Currently all computer hard drives are essentially thin magnetic films covering a flat disk on which the data is written. Disk storage per unit space has roughly doubled every 18-24 months for about the past 40 years in accordance with Moore's Law. The primary force behind this growth has been the ability to read and write information using less space. However, the limits of this growth method are reaching an endpoint as the technological hurdle of reduced space limits the magnetic signal necessary for information retrieval.

New technologies and methods are needed to further increase disk storage per unit space. One potential technology is the use of patterned media meaning small, nanometer dimensioned, magnetic islands on the disk surface where each island could contain one magnetic bit. There is potential for increasing magnetic storage density using this approach. However the islands must be: (1) identical for reliability, (2) minimally spaced apart to keep the hits from erasing each other (based on interacting magnetic fields), and (3) kept large enough for thermal stability. Another potential technology is the use of small magnetic wires (nanowires) which could be grown three-dimensionally (i.e., vertically) creating new layers for data storage. However, fabrication of such nanowire systems in three dimensions has proven difficult.

New technologies for magnetic storage are desirable. Particularly desirable are magnetic storage devices which allow for the injection of magnetic domains using relatively small applied fields and dense packing of the magnetic domains in the storage device without the domains erasing each other (based on interacting magnetic fields).

SUMMARY

Disclosed herein are magnetic storage devices and uses therefor. The devices comprise an injection pad and a nanowire extending from an outer edge of the injection pad. The injection pad and the nanowire of the disclosed magnetic storage devices have a geometry that is designed to optimize high density memory storage via low magnetic field domain wall shifting. The devices may be utilized, for example, for generating and storing magnetic domain walls for application in memory devices, sensor devices, and logic devices.

In some embodiments, the devices comprise: (a) an injection pad; and (b) a nanowire extending tangentially along an X-axis from an outer edge of the injection pad. In other embodiments, the devices comprise (a) an injection pad; and (b) a nanowire extending along an X-axis from an outer edge of the injection pad, the nanowire and the injection pad sharing the outer edge and the outer edge being curved or straight where the nanowire extends from the injection pad. In further embodiments, the devices comprise: (a) an injection pad; and (b) a nanowire extending along an X-axis from an outer edge of the injection pad, the nanowire and the injection pad sharing the outer edge and the outer edge being non-bent where the nanowire extends from the injection pad.

The injection pad and nanowire typically comprise or consist of magnetic metal material and are monolithic. The injection pad and nanowire typically have a thickness of about 1-50 nm (preferably about 2-10 nm, more preferably about 3-7 nm).

The nanowire typically has a top width of about 20-200 nm extending along a Y-axis perpendicular to the X-axis (preferably about 30-150 nm, more preferably about 50-100 nm). In some embodiments, the nanowire has a length extending from the outer edge of the injection pad along the X-axis of at least about 50, 100, 200, 500, or 1000 nm.

The injection pad typically has a top surface area parallel to a plane defined by the X-axis and the Y-axis of about $3\times10^4$–$8\times10^5$ nm$^2$. The injection pad may be circular in shape or polygonal in shape (e.g., triangular, square, rectangular, parallelogram, hexagonal, and the like). For example, where the injection pad is circular, a suitable diameter for the injection pad may include diameters of about 200-1000 nm (preferably about 300-900 nm, more preferably about 400-800 nm). Suitable polygonal shapes may include equilateral polygonal shapes.

Suitable magnetic materials for the device may include, but are not limited to iron, nickel, cobalt, or an alloy of any of these metals. In some embodiments, the magnetic metal material comprises an iron alloy (e.g., an alloy comprising at least about 10% iron by weight). Suitable iron alloys include iron-nickel alloys (e.g., permalloy consisting of about 20% iron and about 80% nickel). In other embodiments, the magnetic metal comprises a nickel alloy (e.g., an alloy comprising at least about 10%, 20%, 30%, 40%, or 50% nickel by weight).

In some embodiments, the device may include one or more structures in the nanowire that a suitable for trapping magnetic domain walls. For example, in some embodiments the nanowire may include one or more notches. In other embodiments, the nanowire may comprise non-magnetic material positioned at the end of the nanowire opposite the injection pad.

The magnetic storage devices disclosed herein may be utilized for generating and storing one or more magnetic domain walls. In some embodiments, the contemplated methods may include the following steps: (a) subjecting the disclosed devices to an external magnetic field oriented along the Y-axis and having an intensity of 20-200 Oersteds; and (b) subjecting the disclosed devices to an external magnetic field oriented along the X-axis and having an intensity of 5-20 Oersteds or subjecting. Optionally, step (a) and step (b) may be performed simultaneously or separately in either order, and optionally may be repeated one or more times (e.g., 1, 2, 3, 4, 5, 6, 7, 8, or more times). In some embodiments, step (a) and step (b) typically are performed for less than 3 nanoseconds (preferably less than 2 nanoseconds, and more preferably less than 1 nanosecond) and preferably may be repeated after less than 1000, 500, 100, 50, 10, or 5 nanoseconds and after reversing the magnetic fields along each respective axis.

In some embodiments of the contemplated methods, the methods further may comprise reversing the external magnetic field oriented along the Y-axis in step (a) and subjecting the device to the reversed external magnetic field oriented along the Y-axis. In further embodiments of the contemplated methods, the methods further may comprise reversing the external magnetic field oriented along the X-axis in step (b) and subjecting the device to the reversed external magnetic field oriented along the X-axis.

In some embodiments, the contemplated methods may include the following steps: (a) subjecting the disclosed devices to an external magnetic field oriented along the Y-axis and having an intensity of 20-200 Oersteds; and (b) subjecting the disclosed devices to a current oriented along the X-axis and having an intensity of 0.1-26 mA. Optionally, step (a) and step (b) may be performed simultaneously or separately in either order, and optionally may be repeated one or more times (e.g., 1, 2, 3, 4, 5, 6, 7, 8, or more times). In some embodiments, step (a) is performed for less than 3 nanoseconds (preferably less than 2 nanoseconds, and more preferably less than 1 nanosecond). Step (b) preferably is performed for less than 30 ns, (more preferably less than 20 ns, and even more preferably less than 10 ns). Step (a) and step (b) may be repeated after less than 1000, 500, 100, 50, 10, or 5 nanoseconds and after reversing the magnetic fields along the Y-axis and/or the direction of the current.

In (b) two composite representations for a transverse domain wall. The net winding number is zero.

Figure 11:
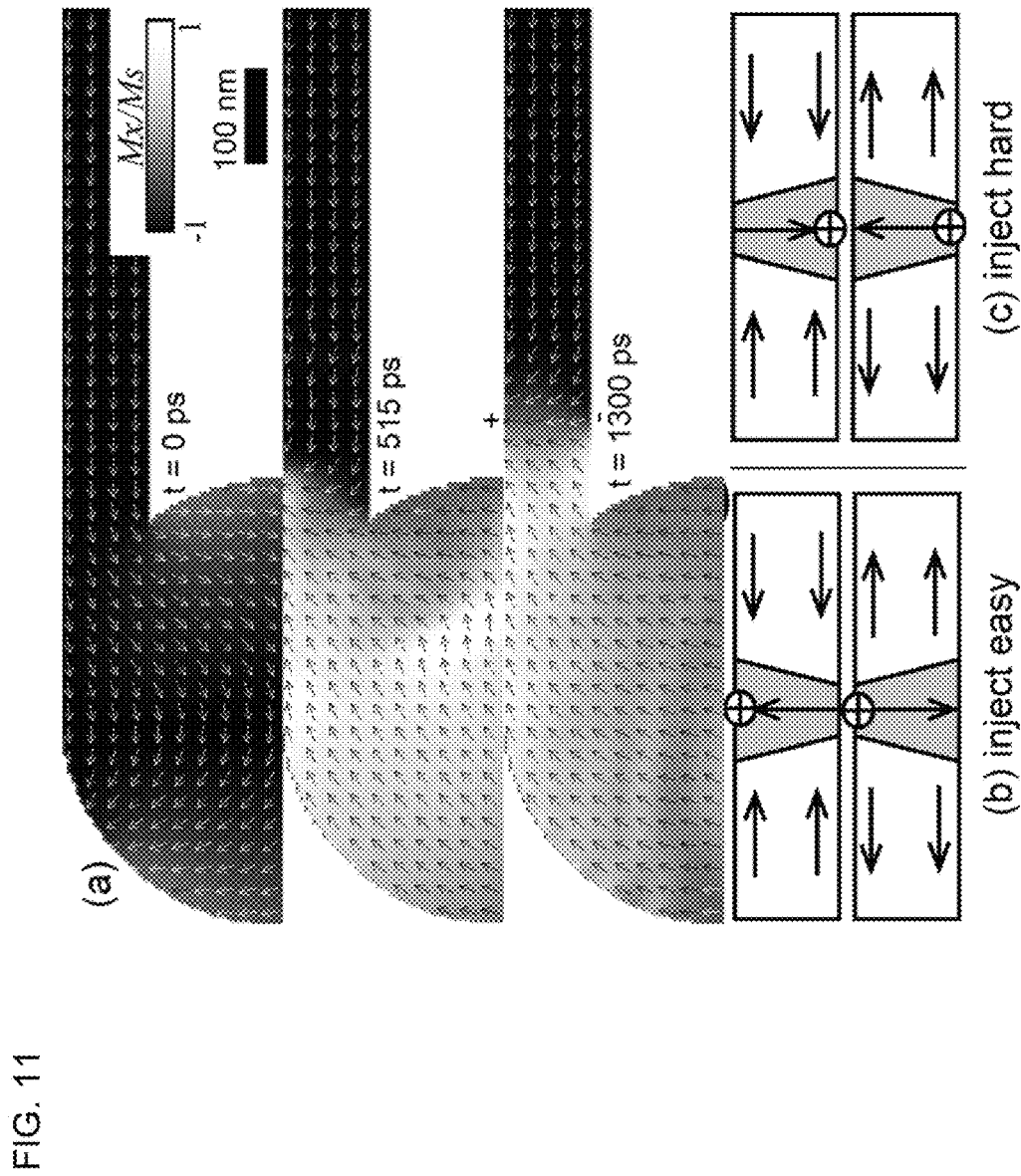

FIG. 11. (a) Simulated time lapse sequence for the typical injection of a domain wall into the wire with a bias field in the +y direction. The injection pad saturates and the wall is pushed into the wire by the small injection field when positive defects are along the top edge (a-b). The domain orientations in (c) have large injection fields because the + defects are pinned at the injection site.

Figure 12:
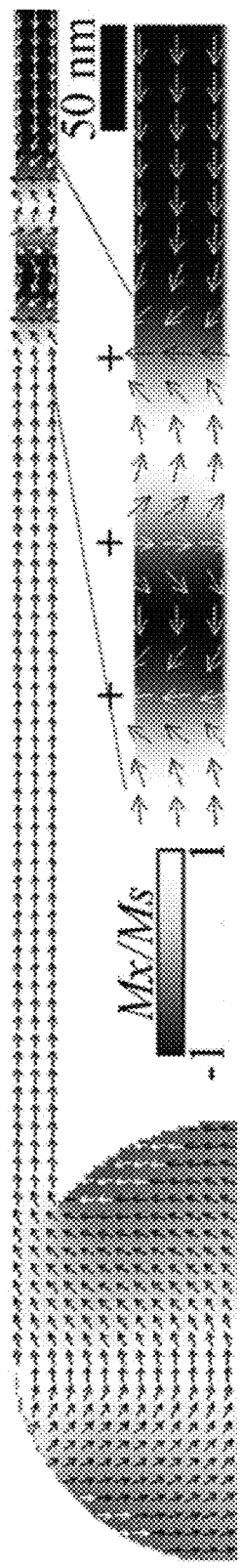

FIG. 12. Simulated image showing three domain walls injected into a 50×5 nm wire. Due to the orientation of the positive defects and the negative defects the domain walls do not annihilate when they collide.

DETAILED DESCRIPTION

Disclosed herein are magnetic storage devices and methods therefor which may be described using several definitions as Discussed below.

Unless otherwise specified or indicated by context, the terms "a", "an", and "the" mean "one or more." In addition, singular nouns such as "device" should be interpreted to mean "one or more devices," unless otherwise specified or indicated by context. A "plurality" as used herein means "more than one" and may mean more than 5, 10, 100, or 1000.

As used herein, "about", "approximately," "substantially," and "significantly" will be understood by persons of ordinary skill in the art and will vary to some extent on the context in which they are used. If there are uses of the term which are not clear to persons of ordinary skill in the art given the context in which it is used, "about" and "approximately" will mean plus or minus ≤10% of the particular term and "substantially" and "significantly" will mean plus or minus >10% of the particular term.

As used herein, the terms "include" and "including" have the same meaning as the terms "comprise" and "comprising."

The disclosed devices include an injection pad and a nanowire extending therefrom. Injections pads and nanowires have been disclosed in the art. (See McGrouther el al., Appl. Phys. Lett. 91, 022506-1 to -3 (2007), the content of which is incorporated by reference in its entirety). Injection pads otherwise may be referred to as "nucleation pads." (See Bryan et al., IEEE Transactions on Magnetics, Vol. 46, No. 4, April 2010, pages 963-967, the content of which is incorporated by reference in its entirety).

Figure 1:
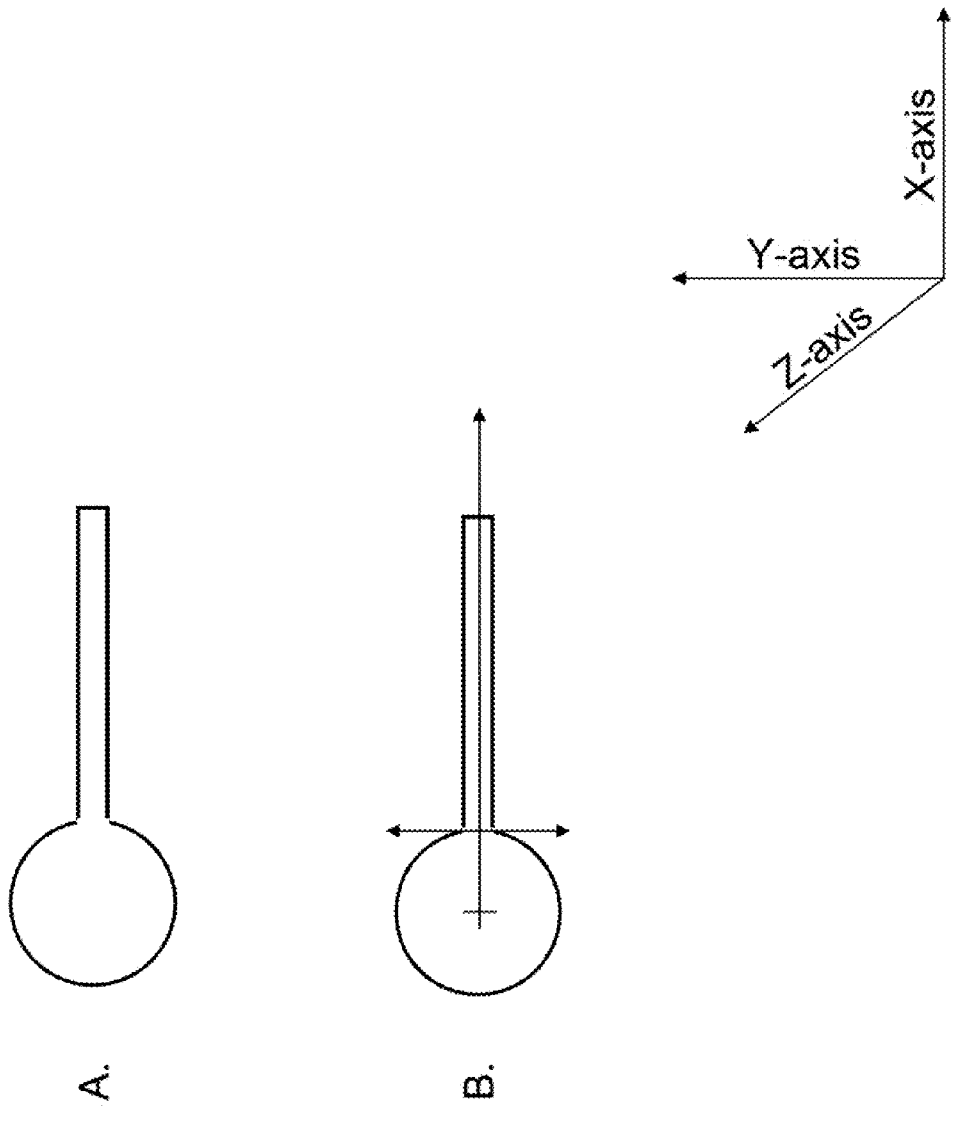
FIG. 1 illustrates geometry of magnetic storage devices of the prior art.

Magnetic storage devices of the prior art are shown in FIG. 1. FIGS. 1A and 1B illustrate magnetic storage devices having a circular injection pad and a nanowire. As shown in FIG. 1A and 1B, the nanowire extends axially along an X-axis from the center of the circular injection pad (i.e., perpendicular to a tangent along the Y-axis from the center circular injection pad (FIG. 1B). Other magnetic storage devices of the prior art may include an oval, vertically oriented injection pad and a nanowire extending axially along an X-axis slightly offset from the center of the injection pad. (See McGrouther et al., Appl. Phys. Lett. 91, 022506-1 to -3 (2007), the content of which is incorporated by reference in its entirety). Recently, rectangular or square nucleation pads having a nanowire extending axially along an X-axis from the center of the pads have been described. (See Bryan et al., IEEE Transactions on Magnetics, Vol. 46, No. 4, April 2010, pages 963-967, the content of which is incorporated by reference in its entirety).

The presently disclosed devices include an injection pad, which, for example may be circular or polygonal in shape, and a nanowire extending therefrom from an outer edge. A nanowire may alternatively be referred to as a "nanostripe."

(See Kunz et al., Appl. Phys. Len. 93, 082503-1 to -3 (2008), the content of which is incorporated by reference in its entirety).

Figure 2:
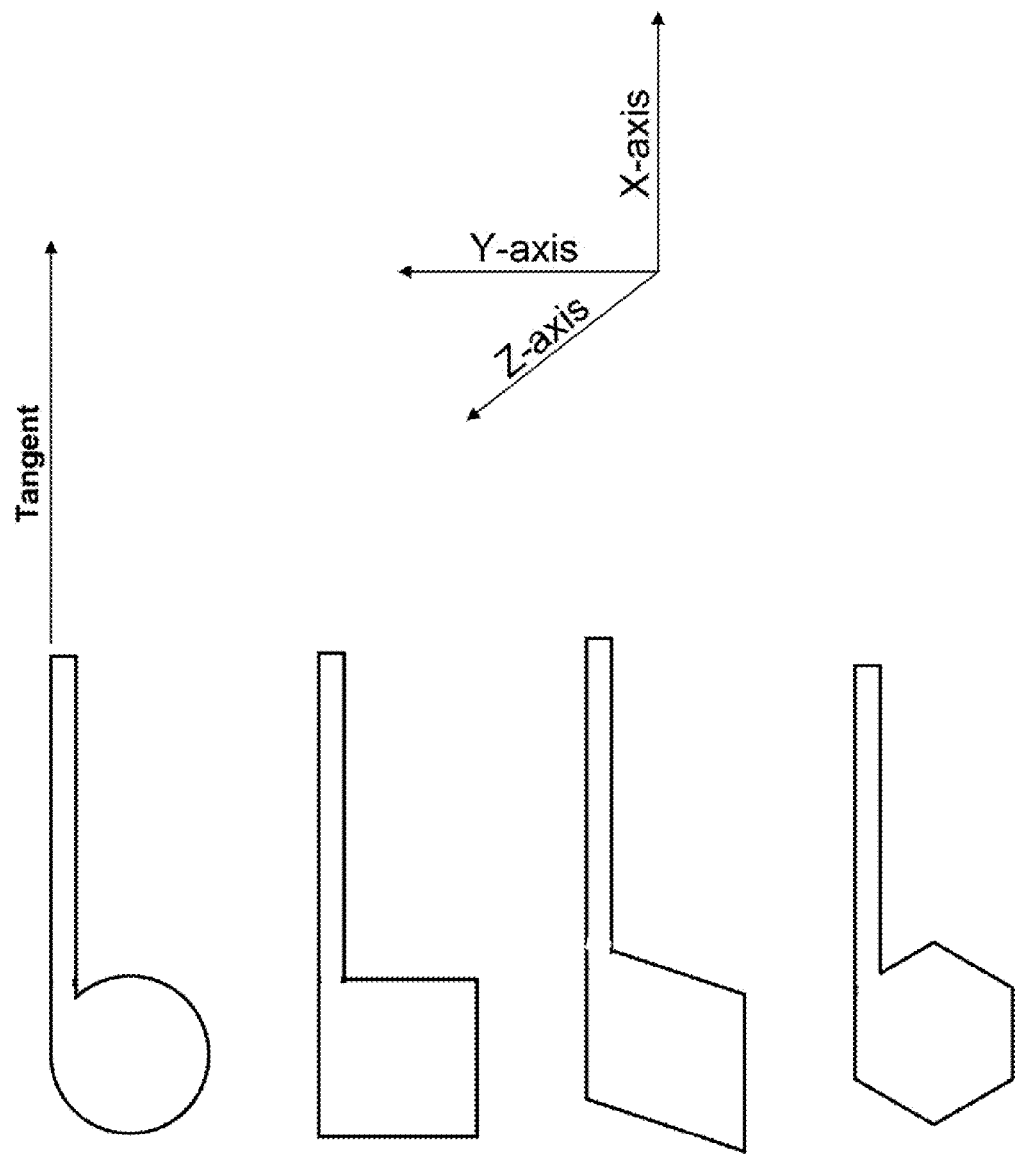
FIG. 2 illustrates several embodiments of the geometry of the magnetic storage devices as contemplated herein.
Figure 3:
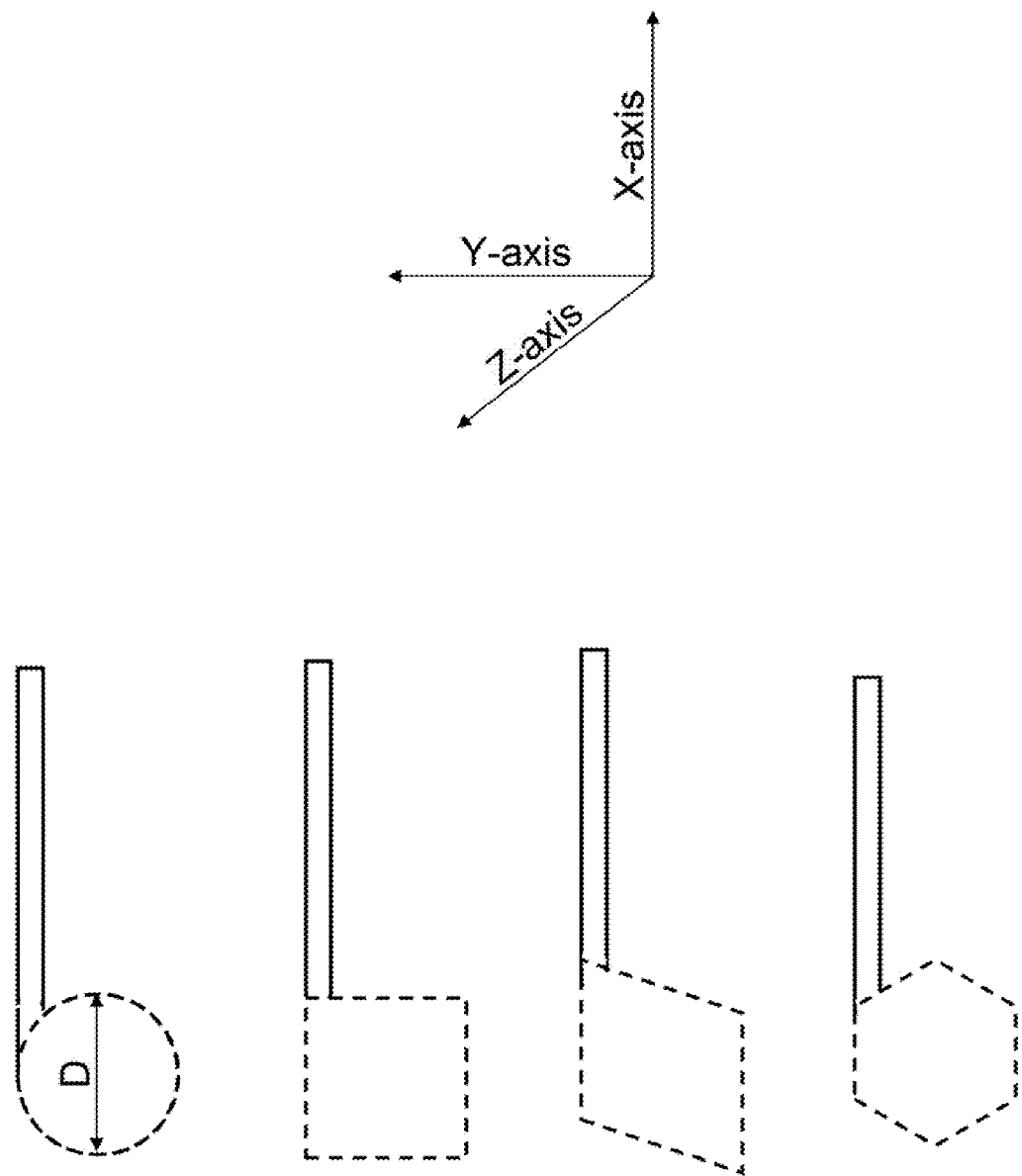
FIG. 3 illustrates several embodiments of the geometry of the magnetic storage devices of FIG. 2 with the top surface area of the injection pad defined with a dashed line.

The devices disclosed herein generally have a shape as exemplified by the devices presented in FIGS. 2 and 3. Accordingly, the presently disclosed devices may be defined as comprising an injection pad and a nanowire where the nanowire extends tangentially along an X-axis from an outer edge of the injection pad. Alternatively, the presently disclosed devices may be defined as comprising an injection pad and a nanowire where the nanowire extends along an X-axis from an outer edge of the injection pad, the nanowire and the injection pad sharing the outer edge and the outer edge being curved or straight. Alternatively, the presently disclosed devices may be defined as comprising an injection pad and a nanowire where the nanowire extends along an X-axis from an outer edge of the injection pad, the nanowire and the injection pad sharing the outer edge and the outer edge being non-bent where the nanowire extends from the injection pad.

The disclosed devices include an injection pad and nanowire extending therefrom where the pad and nanowire are monolithic. The term "monolithic" as used herein means that the pad and nanowire are a unitary structure typically formed from a single piece of material or as a single piece of material without a joining step.

The device comprises magnetic material, preferably soft magnetic material. Suitable magnetic materials for the device may include, but are not limited to iron, nickel, cobalt, or an alloy of any of these metals. In some embodiments, the magnetic metal material comprises an iron alloy (e.g., an alloy comprising at least about 10% iron by weight) or a nickel alloy (e.g., an alloy comprising at least about 10%, 20%, 30%, 40%, or 50% nickel by weight). Suitable iron alloys and nickel alloys include iron-nickel alloys (e.g., an alloy comprising a mixture of iron and nickel where the mixture represents at least 90% of the alloy by weight. A suitable iron-nickel alloy is permalloy which comprises about 20% iron and about 80% nickel by weight. Suitable alloys may comprise material other than iron, nickel, or cobalt (e.g., material such as carbon, manganese, phosphorus, sulfur, silicon, chromium, molybdenum, and aluminum). For example, suitable alloys may comprise up to about 5% of material other than iron, nickel, or cobalt (e.g., such as molybdenum)

The disclosed magnetic storage devices may be fabricated using disclosed techniques. For example, the devices may be fabricated using techniques such as focused ion beam and/or electron beam lithography. (See Thomas et al., Appl. Phys. Lett. 91, 262501 (2005); McGrouther et al., Appl. Phys. Lett. 91, 022506-1 to -3 (2007); Tanigawa et al., Physical Review Lett. 101, 207203-1 to -3 (2008); and O'Brien el al., Physical Review Lett. 103, 077206-1 to -3 (2009); the contents of which are incorporated by reference in their entireties). (See also Bryan et al., IEEE Transactions on Magnetics, Vol. 46, No. 4, April 2010, pages 963-967, the content of which is incorporated by reference in its entirety).

Performance of the presently disclosed magnetic storage devices may be assessed under laboratory techniques including, but not limited to, Lorenz transmission electron microscopy (LTEM), magnetic force microscopy (MFM), magnetic transmission X-ray microscopy (M-TXM). (See McGrouther et al., Appl. Phys. Lett. 91, 022506-1 to -3 (2007); Parkin et al., Science, Vol. 320, Apr. 11, 2008; and Bryan el al., IEEE Transactions on Magnetics, Vol. 46, No. 4, April 2010, pages 963-967, the contents of which are incorporated by reference in their entireties). In addition, performance of the presently disclosed magnetic devices may be assessed via simulation by integrating the three-dimensional time dependent Landau-Lifshitz equation of motion for a magnetic moment in an applied field using computer software such as LLG Micromagnetic Simulator™. (See Kunz, J. Applied Phys. 99, 08G107 (2006); Kunz et al., J. Applied Phys. 103, 07D903 (2008); Kunz et al., Applied Phys. Lett. 93, 082503-1 to -3 (2008); Kunz, Applied Phys. Lett. 94, 132502 (2009); Kunz et al., Applied Phys. Lett. 94, 192504-1 to -3 (2009), Kunz et al., IEEE Transaction on Magnetics, Vol. 46, No. 6, June 2010, pages 1559-1561; Kunz, SPIE Newsroom, 10.1117/2.1201008.003204 (2010); and Kunz et al., Spintronics III, Edited by Drouhin et al., and published in the Proc. of the Society of Photographic Instrumentation Engineers (SPIE), Vol. 7760, 776005-1 to -7 (2010); the contents of which are incorporated by reference in their entireties).

The presently disclosed magnetic storage devices may be utilized in systems including, but not limited to, memory systems and sensor systems. (See, e.g., U.S. Pat. Nos. 6,614,084; 6,774,391; 6,834,005; 6,867,988; 6,898,132; 6,920,062; 6,970,379; 7,031,178; 7,236,386; 7,315,470; 7,492,622; 7,502,244; 7,551,469; 7,554,835; 7,626,844; 7,667,994; 7,710,769; and 7,710,770; the contents of which are incorporated by reference in their entireties). For example, memory systems or sensor systems may comprise a plurality of the magnetic storage devices disclosed herein. The magnetic storage devices disclosed herein may be utilized as storage devices for data, for example, data in the form of magnetic domain walls as disclosed. (See Allwood et al., Science, Vol. 309, Sep. 9, 2005, pages 1688-1692; Hayashi el al., Science, Vol. 320, Apr. 11, 2008, pages 209-211, Cho, Science, Vol. 320, Apr. 11, 2008, page 166; Parkin et al., Science, Vol. 320, Apr. 11, 2008, pages 190-194, the contents of which are incorporated by reference in their entireties). The presently disclosed devices can compliment or replace existing devices such as hard disk drives (HDDs), or other solid state drives such as 'not-and' (NAND) Flash memory or dynamic random access memory (DRAM).

The magnetic storage devices disclosed herein also may be utilized in memristor systems. (See, e.g., Strukov et al., Nature Vol. 453, May 1, 2008, pages 80-83; and Williams, IEEE Spectrum, December 2008, pages 29-35; the contents of which are incorporated by reference in their entireties). The presently disclosed devices may be particularly desirable in memristor systems. A memristor is a device whose resistance depends on a property of the device, which can be changed reliably and controllably. The resistance is maintained when a memristor system is turned off such that the resistance remains the same when the memristor system is turned back on. In the presently disclosed devices, resistance of a nanowire in the device would depend on the number of domain walls in the wire. Thus, the presently disclosed devices meet the criteria for a memristor.

Magnetic domain walls may be generated in the presently disclosed magnetic devices by subjecting the devices to external magnetic fields, otherwise referred to as "domain wall injection." A magnetic domain wall is a mobile interface between regions of oppositely aligned magnetization (magnetic domains). Generation of magnetic domain walls in nanowires via external magnetic fields has been disclosed. (See, e.g., McGrouther et al., Appl. Phys. Lett. 91, 022506-1 to -3 (2007); Tanigawa et al., Physical Review Lett. 101, 207203-1 to -3 (2008); and O'Brien et al., Physical Review Lett. 103, 077206-1 to -3 (2009); Bryan et al., IEEE Transactions on Magnetics, Vol. 46, No. 4, April 2010, pages 963-967; the contents of which are incorporated by reference in their entireties). Transverse magnetic fields may be utilized to induce domain walls.

The presently disclosed magnetic storage devices have a geometry that is designed to minimize the strength of applied field along the X-axis that is necessary to inject a magnetic domain wall. Multiple domain walls may be injected and quickly moved in the nanowires of the devices via external magnetic fields. The presently disclosed magnetic storage devices may be incorporated into any device that utilizes magnetic fields to inject domain walls, including, but not limited to storage, sensor, logic, memristor devices. Speed of operation and the ability to read and write data in nanowires require injecting and moving magnetic domain walls. Submicrometer planar nanowires made from soft magnetic material have been shown to form an excellent conduit for domain walls.

In the disclosed magnetic storage devices, a nanowire is attached at the outer edge of the injection pad and extends from the injection pad along an X-axis. Typically the injection pad and the nanowire are extremely thin, for example, on the order of about 5 nm along a Z-axis, and preferably less than about 9 nm along a Z-axis. The nanowire may be of any suitable length along the X-axis. However, for dense packing of information (i.e., magnetic domain walls), preferably the nanowire has a width of 50-100 nm along a Y-axis. The injection pad may be circular or polygonal. Where circular, preferably, the injection pad has a radius less than about 500 nm. One or more externally applied magnetic fields (e.g., transverse fields) are applied to the device to magnetize the injection pad and inject and move magnetic domains in the nanowire. As such, many bits can be "written" into a single wire.

The presently disclosed devices may be utilized in methods for injecting multiple magnetic domain walls and moving them quickly along nanowires using relatively small applied external magnetic fields. This technique allows for densely packed magnetic domain walls in the nanowires that do not erase each other. The use of relatively small applied magnetic fields through the minimization of the strength of the applied field necessary to inject the magnetic domain wall is significant because magnetic domains move very slowly in large applied magnetic fields which increases the time required to read/write information.

In the presently disclosed devices, the anisotrophy of the nanowire promotes magnetization alignment along the long axis of the nanowire (i.e., along the X-axis). An applied field may be used to control the magnetization in the nanopad and to inject and move the magnetic domain walls after the domain walls are generated in the nanowire. The use of relatively small applied magnetic fields biases movement of the magnetic domain wall in the nanowire. For such use, a magnetic field preferably less than 20 Oersteds may be applied in the same direction as the nanowire (i.e., along the X-axis). A second magnetic field of preferably between approximately 50-200 Oersteds may be used to control the injection and movement of magnetic domain walls. The second magnetic field is applied in a direction perpendicular to the nanowire (i.e., a field transverse to the magnetic field less than 20 Oersteds.

The geometry of the presently disclosed magnetic storage device permits the use of relatively small magnetic fields for the injection and movement of multiple domain walls. The relatively small applied magnetic field allows multiple magnetic domain walls to be injected and moved without erasing data. In the present state of the art, only a current, but not a magnetic field, could successfully inject and move multiple domain walls without erasing the data. A further advantage of using magnetic fields to inject and move domain walls is that magnetic-generated domain walls move at least one order of magnitude (10 times) faster than current-driven domain walls are capable of moving without excessive heating of the wire, thus increasing the read/write speed and reliability for the device.

In some embodiments of the presently disclosed methods, domain walls may be generated and moved only by transverse magnetic fields. However, in other embodiments, domain walls may be generated by a magnetic field (e.g., oriented along the Y-axis) and may be moved by a transverse current (e.g., oriented along the X-axis). (See Parkin et al., Science 320, pages 190-194 (2008); Metaxas et al., Applied Phys. Lett. 97 182506 (2010); and Jang et al., J. Applied Phys. 108, 063904 (2010), the contents of which are incorporated by reference in their entireties).

The presently disclosed devices may be utilized in memory, sensor, and logic systems. The use of magnetic storage devices is desirable in these systems because (1) they use low power, meaning that they save their information when power is off, and thus reduce or eliminate boot up time when a system is powered on; and (2) they use less power to operate which means longer battery life in systems.

ILLUSTRATIVE EMBODIMENTS

The following embodiments are illustrative and not intended to limit the claimed subject matter.

Embodiment 1. A magnetic storage device comprising: (a) an injection pad; and (b) a nanowire extending tangentially along an X-axis from an outer edge of the injection pad; wherein: the injection pad and nanowire comprise magnetic metal material and are monolithic; the nanowire has a top width of 20-200 nm extending along a Y-axis perpendicular to the X-axis; the injection pad has a top surface area parallel to a plane defined by the X-axis and the Y-axis of $3 \times 10^4 - 8 \times 10^5$ nm$^2$ (which corresponds to a circular injection pad having a diameter of about 200-1000 nm); and the injection pad and nanowire have a thickness of 1-50 nm along an Z-axis perpendicular to the X-axis and the Y-axis (preferably a thickness of 2-10 nm, more preferably a thickness of 3-7 nm).

Embodiment 2. The device of embodiment 1, wherein the magnetic metal material comprises iron, nickel, cobalt, or an alloy thereof.

Embodiment 3. The device of embodiment 2, wherein the magnetic metal material comprises an iron alloy.

Embodiment 4. The device of embodiment 3, wherein the iron alloy is an iron-nickel alloy.

Embodiment 5. The device of embodiment 4, wherein the iron-nickel alloy is permalloy.

Embodiment 6. The device of any of embodiments 1-5, wherein the nanowire has a top width of 50-100 nm.

Embodiment 7. The device of any of embodiments 1-6, wherein the nanowire has a length extending from the outer edge of the injection pad of at least about 50, 100, 200, 500, or 1000 nm.

Embodiment 8. The device of any of embodiments 1-7, wherein the nanowire has a length extending from the outer edge of the injection pad of at least about 1000 nm.

Embodiment 9. The device of any of embodiments 1-7, wherein the injection pad is circular.

Embodiment 10. The device of embodiment 9, wherein the injection pad has a diameter of about 200-1000 nm (preferably about 300-900 nm, more preferably about 400-800 nm).

Embodiment 11. The device of any of embodiments 1-8, wherein the injection pad is a polygon (e.g., a triangle, square, rectangle, parallelogram, pentagon, hexagon, heptagon, octagon or the like) and optionally the polygon is an equilateral polygon.

Embodiment 12. The device of any of embodiments 1-11, wherein the injection pad and nanowire have a thickness of about 1-50 nm (preferably about 2-10 nm, more preferably about 3-7 nm).

Embodiment 13. The device of any of embodiments 1-12, further comprising one or more notches in the nanowire.

Embodiment 14. The device of any of embodiments 1-12, further comprising non-magnetic material positioned at the end of the nanowire opposite the injection pad.

Embodiment 15. The device of any of embodiments 1-12, further comprising one or more notches in the nanowire and non-magnetic material positioned at the end of the nanowire opposite the injection pad.

Embodiment 16. A magnetic storage device comprising: (a) an injection pad; and (b) a nanowire extending along an X-axis from an outer edge of the injection pad, the nanowire and the injection pad sharing the outer edge and the outer edge being curved or straight where the nanowire extends from the injection pad; wherein: the injection pad and nanowire comprise magnetic metal material and are monolithic; the nanowire has a top width of 20-200 nm extending along a Y-axis perpendicular to the X-axis; the injection pad has a top surface area parallel to a plane defined by the X-axis and the Y-axis of $3\times10^4$–$8\times10^5$ nm$^2$ (which corresponds to a circular injection pad having a diameter of about 200-1000 nm); and the injection pad and nanowire have a thickness of 1-50 nm along an Z-axis perpendicular to the X-axis and the Y-axis (preferably a thickness of 2-10 nm, more preferably a thickness of 3-7 nm).

Embodiment 17. The device of embodiment 16, wherein the magnetic metal material comprises iron, nickel, cobalt, or an alloy thereof.

Embodiment 18. The device of embodiment 17, wherein the magnetic metal material comprises an iron alloy.

Embodiment 19. The device of embodiment 18, wherein the iron alloy is an iron-nickel alloy.

Embodiment 20. The device of embodiment 19, wherein the iron-nickel alloy is permalloy.

Embodiment 21. The device of any of embodiments 1-20, wherein the nanowire has a top width of 50-100 nm.

Embodiment 22. The device of any of embodiments 1-21, wherein the nanowire has a length extending from the outer edge of the injection pad of at least about 50, 100, 200, 500, or 1000 nm.

Embodiment 23. The device of any of embodiments 1-22, wherein the nanowire has a length extending from the outer edge of the injection pad of at least about 1000 nm.

Embodiment 24. The device of any of embodiments 1-22, wherein the injection pad is circular.

Embodiment 25. The device of embodiment 24, wherein the injection pad has a diameter of about 200-1000 nm (preferably about 300-900 nm, more preferably about 400-800 nm).

Embodiment 26. The device of any of embodiments 1-23, wherein the injection pad is a polygon (e.g., a triangle, square, rectangle, parallelogram, pentagon, hexagon, heptagon, octagon or the like) and optionally the polygon is an equilateral polygon.

Embodiment 27. The device of any of embodiments 1-26, wherein the injection pad and nanowire have a thickness of about 1-50 nm (preferably about 2-10 nm, more preferably about 3-7 nm).

Embodiment 28. The device of any of embodiments 1-27, further comprising one or more notches in the nanowire.

Embodiment 29. The device of any of embodiments 1-27, further comprising non-magnetic material positioned at the end of the nanowire opposite the injection pad.

Embodiment 30. The device of any of embodiments 1-27, further comprising one or more notches in the nanowire and non-magnetic material positioned at the end of the nanowire opposite the injection pad.

Embodiment 31. A magnetic storage device comprising: (a) an injection pad; and (b) a nanowire extending along an X-axis from an outer edge of the injection pad, the nanowire and the injection pad sharing the outer edge and the outer edge being non-bent where the nanowire extends from the injection pad; wherein: the injection pad and nanowire comprise magnetic metal material and are monolithic; the nanowire has a top width of 20-200 nm extending along a Y-axis perpendicular to the X-axis; the injection pad has a top surface area parallel to a plane defined by the X-axis and the Y-axis of $3\times10^4$–$8\times10^5$ nm$^2$ (which corresponds to a circular injection pad having a diameter of about 200-1000 nm); and the injection pad and nanowire have a thickness of 1-50 nm along an Z-axis perpendicular to the X-axis and the Y-axis (preferably a thickness of 2-10 nm, more preferably a thickness of 3-7 nm).

Embodiment 32. The device of embodiment 31, wherein the magnetic metal material comprises iron, nickel, cobalt, or an alloy thereof.

Embodiment 33. The device of embodiment 32, wherein the magnetic metal material comprises an iron alloy.

Embodiment 34. The device of embodiment 33, wherein the iron alloy is an iron-nickel alloy.

Embodiment 35. The device of embodiment 34, wherein the iron-nickel alloy is permalloy.

Embodiment 36. The device of any of embodiments 1-35, wherein the nanowire has a top width of 50-100 nm.

Embodiment 37. The device of any of embodiments 1-36, wherein the nanowire has a length extending from the outer edge of the injection pad of at least about 50, 100, 200, 500, or 1000 nm.

Embodiment 38. The device of any of embodiments 1-37, wherein the nanowire has a length extending from the outer edge of the injection pad of at least about 1000 nm.

Embodiment 39. The device of any of embodiments 1-37, wherein the injection pad is circular.

Embodiment 40. The device of embodiment 39, wherein the injection pad has a diameter of 200-1000 nm (preferably about 300-900 nm, more preferably about 400-800 nm).

Embodiment 41. The device of any of embodiments 1-38, wherein the injection pad is a polygon (e.g., a triangle, square, rectangle, parallelogram, pentagon, hexagon, heptagon, octagon or the like) and optionally the polygon is an equilateral polygon.

Embodiment 42. The device of any of embodiments 1-41, wherein the injection pad and nanowire have a thickness of about 1-50 nm (preferably about 2-10 nm, more preferably about 3-7 nm).

Embodiment 43. The device of any of embodiments 1-42, further comprising one or more notches in the nanowire.

Embodiment 44. The device of any of embodiments 1-42, further comprising non-magnetic material positioned at the end of the nanowire opposite the injection pad.

Embodiment 45. The device of any of embodiments 1-42, further comprising one or more notches in the nanowire and non-magnetic material positioned at the end of the nanowire opposite the injection pad.

Embodiment 46. A memory device comprising a plurality of the magnetic storage devices according to any of embodiments 1-45.

Embodiment 47. The memory device of embodiment 46, wherein the device is a memristor.

Embodiment 48. A sensor device comprising a plurality of the magnetic storage devices according to any of embodiments 1-45.

Embodiment 49. A method of forming domain walls in a magnetic storage device, the method comprising the following steps: (a) subjecting the device of any of embodiments 1-45 to an external magnetic field oriented along the Y-axis and having an intensity of 20-200 Oersteds; (b) subjecting the device of any of embodiments 1-45 to an external magnetic field oriented along the X-axis and having an intensity of 5-20 Oersteds; and optionally wherein step (a) and step (b) are performed simultaneously or separately, and optionally may be repeated one or more times.

Embodiment 50. The method of embodiment 49, wherein step (a), step (b), or both are repeated at least eight times.

Embodiment 51. The method of embodiment 49 or 50, wherein step (a) and step (b) are performed for less than 3 nanoseconds (preferably less than 2 nanoseconds, and more preferably less than 1 nanosecond).

Embodiment 52. The method of any of embodiments 49-51, comprising reversing the external magnetic field oriented along the Y-axis and subjecting the device to the reversed external magnetic field oriented along the Y-axis.

Embodiment 53. The method of any of embodiments 49-52, comprising reversing the external magnetic field oriented along the X-axis and subjecting the device to the reversed external magnetic field oriented along the X-axis.

EXAMPLES

The following examples are illustrative and not intended to limit the claimed subject matter.

Example 1

Low Field and Controlled Domain Wall Structure During Injection into Nanostripes Abstract Fast, reliable domain wall motion is critical for many proposed devices in logic, sensing and recording. However a domain wall in a nanostripe moves the quickest and most reliably when driven by a magnetic field of strength less than about 20 Oe in permalloy. This field is associated with Walker breakdown and the exact value depends on the material properties and wire dimensions. The breakdown field is much less than the typical nucleation field necessary to inject the domain wall into the wire-which automatically sets up slow domain wall motion. Landau-Lifshitz simulation was utilized to study the effect of several geometries including straight ends, tapered ends, pads, and rings. The results illustrate that the placement of a nanostripe at the outer edge of an injection pad and ring significantly lowers the strength of the injection field to under 10 Oe and decreases the amount of time necessary to inject the wall. The ring and pad magnetizations also are easily manipulated so that multiple domain walls can be injected into the nanostripe with a known magnetic structure. The dependence of the injection field on an in-plane transverse field also was studied. This additional field was found to reduce the required injection field to lead to faster domain wall motion because its structure is known. (See Kunz el al., J. Applied Physics, 103, 07D903 (2008) the content of which is incorporated herein by reference in its entirety).

Background and Motivation

Figure 4:
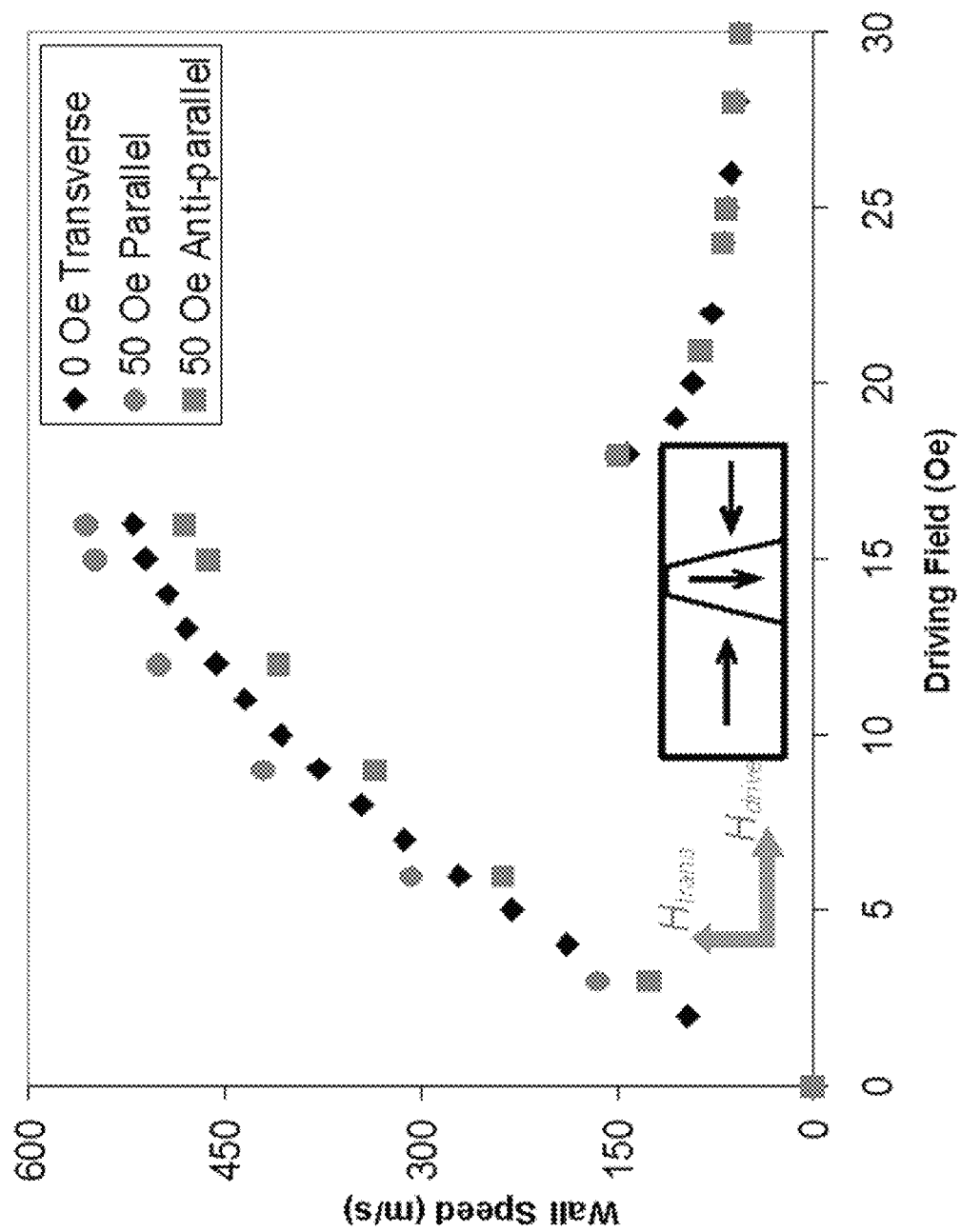
FIG. 4 illustrates the relationship between domain wall structure and wall motion.

Fast domain wall motion and reliable domain wall structure is critical for many proposed devices. The highest domain wall speeds are found for only a small range of weak applied fields—the largest is the so-called critical Walker field. (See Schryer et al., J. Applied Physics 45 (1974), the content of which is incorporated herein by reference in its entirety). For larger fields the domain wall structure is known to change and for even larger fields the domain wall structure can become quite complicated. Knowledge of the domain wall structure also allows for faster wall motion (FIG. 4). (See also Kunz et al., J. Applied Physics, 103, 07D903 (2008) the content of which is incorporated herein by reference in its entirety). However, in nanowire devices the domain wall must also be nucleated at the end of the wire. These nucleation fields are often larger than the critical field which leads to slow and complicated domain wall motion and the wall structure is also not known. Here we present simulation results showing low-field domain wall injection with a known wall structure. (See Kunz el al., Applied Physics Lett 93, 082503-1 to -3 (2008)). The technique can be used to inject multiple domain walls.

Figure 5:
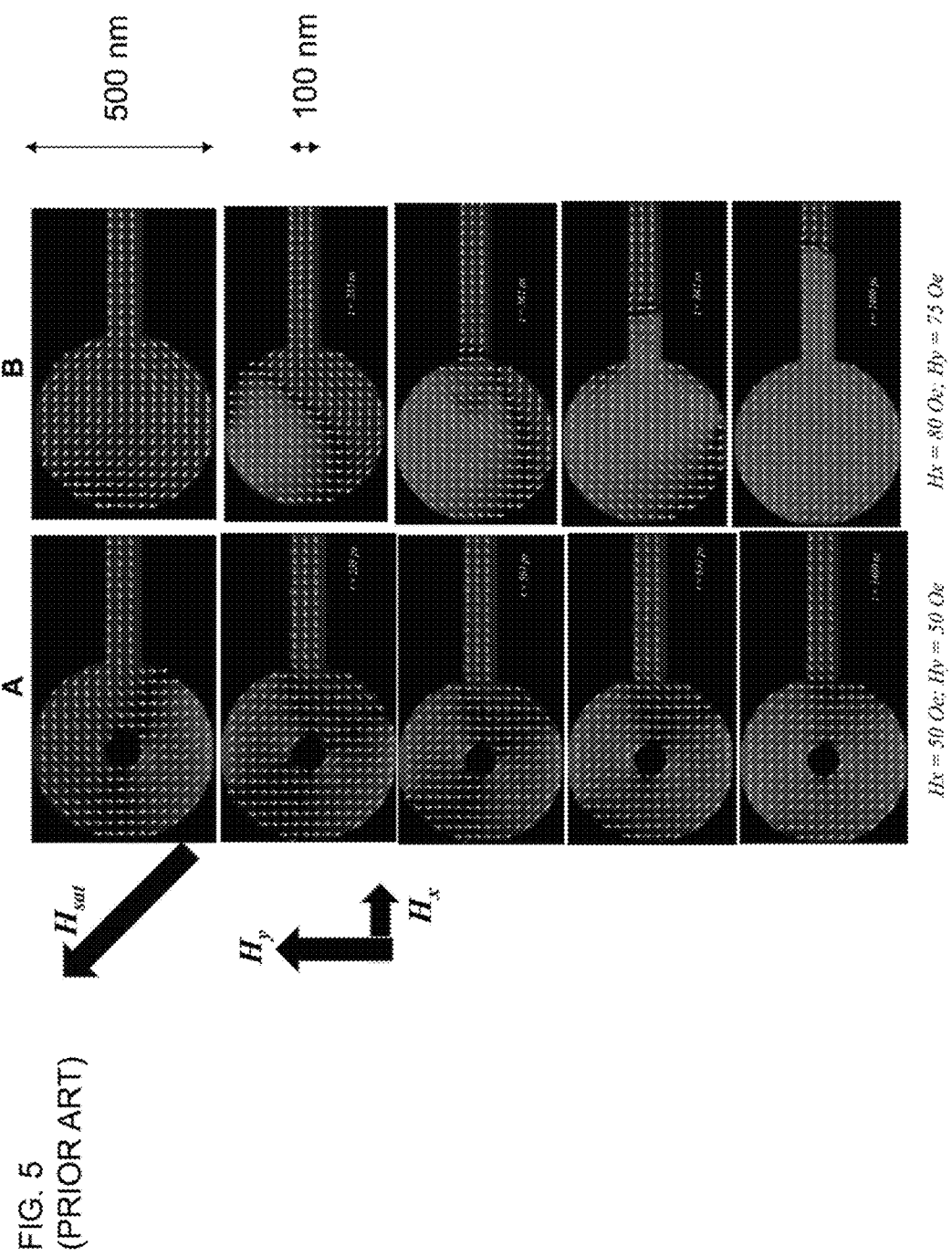
FIG. 5 illustrates domain wall injection in devices having an injection pad, either ring-shaped (left) or disk-shaped (right) and a nanowire extending substantially centrally from the injection pad.
Figure 6:
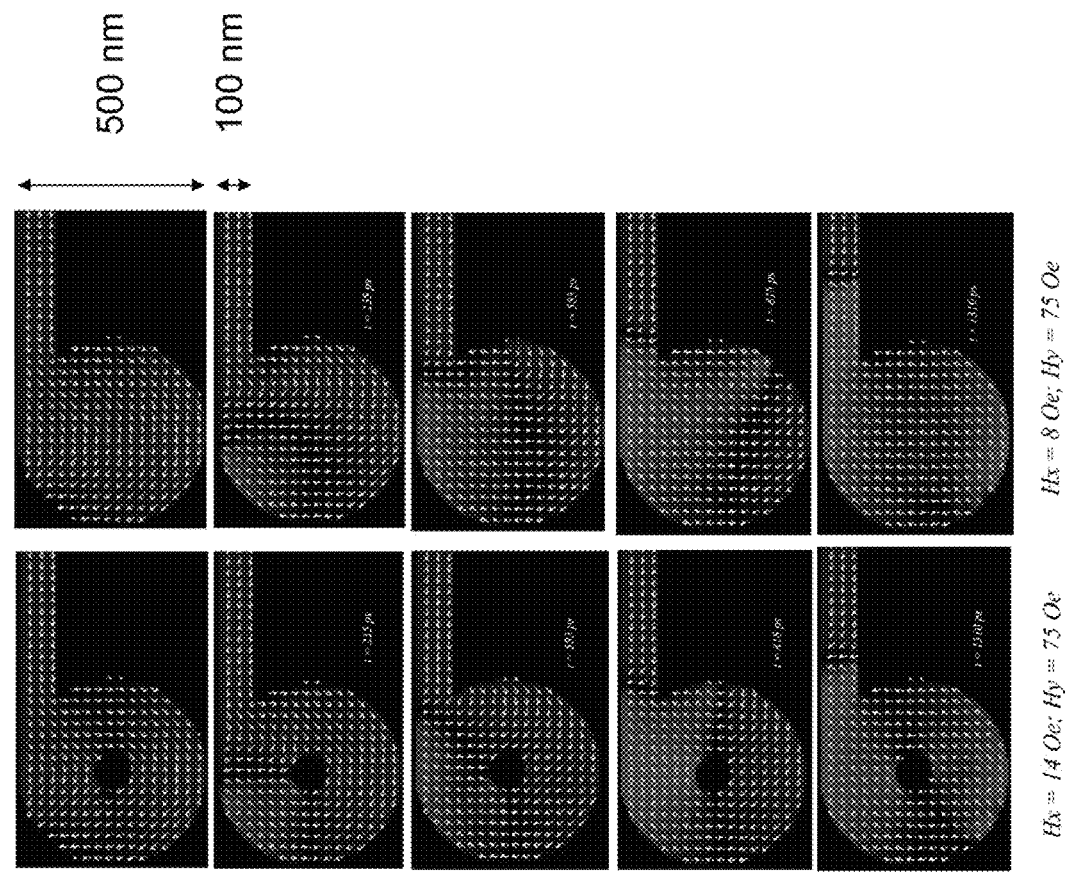
FIG. 6 illustrates domain wall injection in devices having an injection pad, either ring-shaped (left) or disk-shaped (right) and a nanowire extending from an outer top edge of the pad.

FIGS. 5 and 6 illustrates domain wall injection in devices of the prior art as compared to devices as contemplated herein. In FIG. 5, illustrates domain wall injection in devices having an injection pad, either ring-shaped (left) or disk-shaped (right) and a nanowire extending substantially centrally from the injection pad. In FIG. 5, shown are magnetization analyses of the initial state after saturation using a bias field to create walls of known orientation, and magnetization analyses after applying fields corresponding to (A) Hx=50 Oe and Hy=50 Oe, or (B) Hx=80 Oe; Hy=75 Oe, for 235 ps, 561 ps, 841 ps, or 1400 ps. FIG. 6 illustrates domain wall injection in devices having an injection pad, either ring-shaped (left) or disk-shaped (right) and a nanowire extending from an outer top edge of the pad. In FIG. 6, shown are magnetization analyses of the initial state after saturation using a bias field to create walls of known orientation, and magnetization analyses after applying fields corresponding to (A) Hx=14 Oe and Hy=75 Oe, or (B) Hx=8 Oe; Hy=75 Oe, for 235 ps, 585 ps, 818 ps, or 1310 ps. Together, FIGS. 5 and 6 illustrate that moving the wire to the top of the injection pad or ring significantly lowers the injection field required for generating and moving domain walls.

Figure 7:
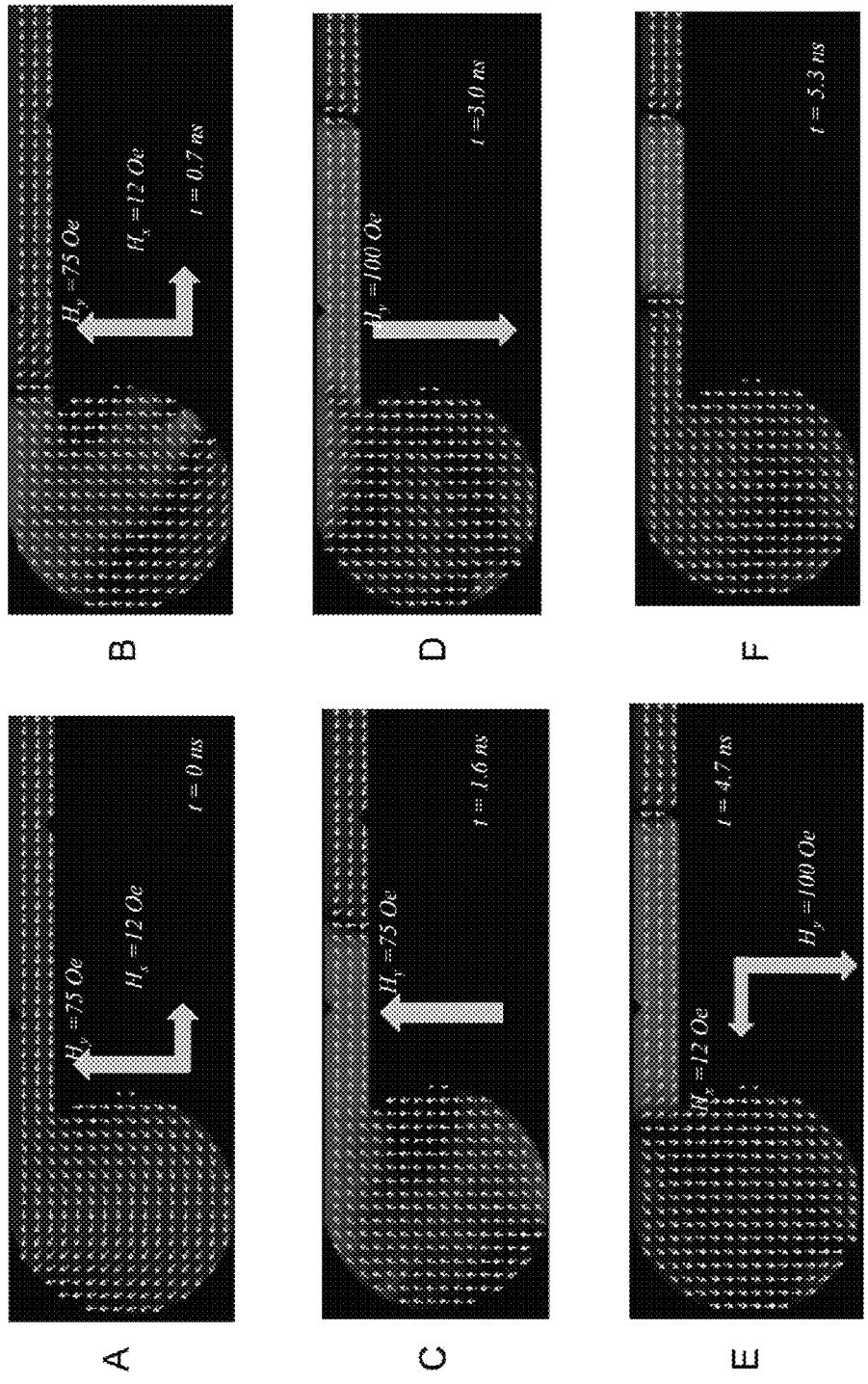
FIG. 7A-7F illustrates that a transverse field can be utilized to change the magnetization of the pad and can be reversed to inject multiple, closely spaced walls in under 5 nanoseconds.

FIG. 7 illustrates that a transverse field can be utilized to change the magnetization of the pad and can be reversed to inject multiple, closely spaced walls in under 5 nanoseconds. As shown in FIG. 7, a relatively low intensity transverse field changes the pad magnetization easily. The field can be reversed to inject multiple domain walls (e.g., two closely spaced walls in less than 5 ns). In FIGS. 7A and 7B, a small injection field is applied with a bias field to inject a domain wall with a known magnetic state. The domain wall is injected within a nanosecond. As shown in FIG. 7C, a domain wall magnetized up is unaffected by a top notch but captured by a bottom notch. In FIG. 7D, the bias field is reversed, changing the pad magnetization. In FIG. 7E, reversal of the injection field injects a domain wall with opposite magnetization. As shown in FIG. 7F, this domain wall with opposite magnetization is captured by the top notch.

Figure 8:
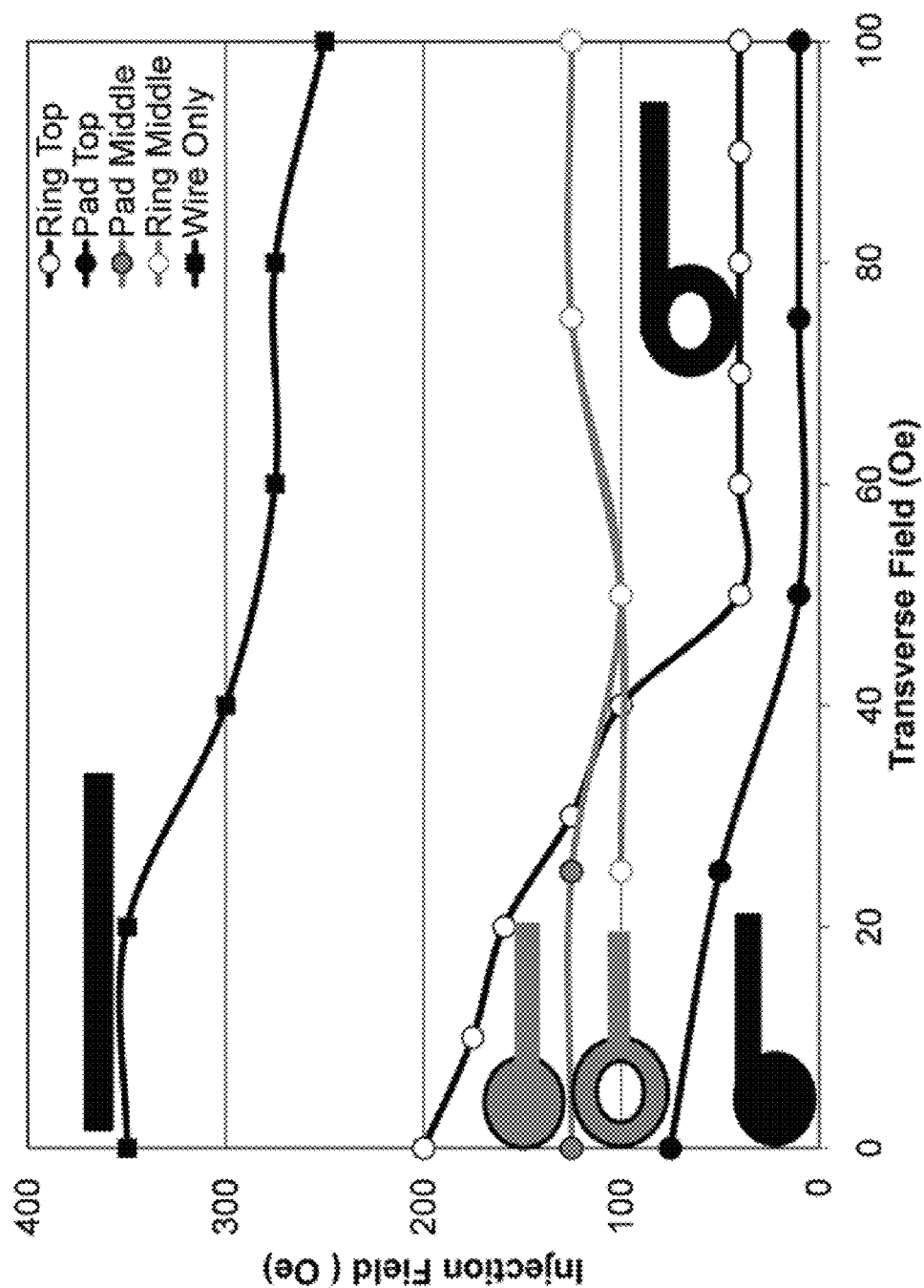
FIG. 8 illustrates the dependence of the injection field on the transverse field for devices having various geometries: ring with a nanowire on top; pad with a nanowire on top, pad with a nanowire in the middle; ring with a nanowire in the middle; and a wire only.

FIG. 8 illustrates the dependence of the injection field on the transverse field for devices having various geometries: ring with a nanowire on top; pad with a nanowire on top, pad with a nanowire in the middle; ring with a nanowire in the middle; and a wire only. A pad with a top wire requires the lowest intensity injection field versus the intensity of the transverse field (bias field).

Conclusions

Moving the wire to the top (bottom) of the injection pad reduces the domain wall injection field by an order of magnitude. The injection field is below the critical Walker field for fast, reliable walls. A transverse (bias) field further reduces the injection field and creates walls of a known orientation which further increases the wall speed.

Example 2

Dependence of Domain Wall Structure for Low Field Injection into Magnetic Nanowires Reference is made to Kunz et al., Applied. Phys. Lett. 94, 192504-1 to -3 (2009), the content of which is incorporated by reference herein in its entirety.

Abstract

Micromagnetic simulation is used to model the injection of a domain wall into a thin magnetic nanowire with field strengths less than the Walker field. This ensures fast, reliable motion of the wall. When the wire is located at the edge of a small injecting disk, a bias field used to control the orientation of the domain wall can reduce the pinning potential of the structure. The low-field injection is explained by a simple model which relies on the topological nature of a domain wall. The technique can quickly inject multiple domain walls with a known magnetic structure.

Methods, Results and Discussion

The motion of a domain wall through a long, narrow nanowire has been studied extensively due to its importance in several proposed devices in logic, sensing, and recording[1,2]. Physically it is important to understand how to move the domain wall quickly and reliably which in part depends on the magnetic structure of the domain wall[3-6]. In a thin, narrow nanowire the presence of a domain wall is energetically unfavorable so it is necessary to inject the domain wall into the wire. It is known that a domain wall moves the quickest, with a constant structure when driven by magnetic fields weaker than the so-called Walker field which is typically about 15 Oe in a nanowire[3,7]. Here micromagnetic simulation results were used to develop a technique to quickly inject a domain wall with a controllable magnetic structure into a nanowire with external magnetic field strengths less than the Walker field. The injection technique demonstrates the influence of the topological nature of a domain wall. Controlling the topology of the domain wall makes it possible to reliably inject and densely pack multiple domain walls into a wire which is necessary for viable magnetic nanowire devices.

The domain wall injection was simulated by integrating the three-dimensional time dependent Landau-Lifshitz equation of motion for a magnetic moment in an applied field[8]. The materials parameters used are for a permalloy like material ($M_s$=8×10$^5$ A/m, A=1.3×10$^{-11}$ J/m) with a damping constant of 0.008 and a cubic discretization cell size ranging from 2-5 nm on edge. For the simulation results presented here the nanowire has a rectangular cross-sectional area of 100×5 nm$^2$ and the injection pad is a 5 nm thick disk with a 500 nm diameter. The diameter of the pad was kept small so that it would remain single domain as vortices and domain walls inside the pad influence the injection properties. In each case a saturating field was applied at 170° from the +x-axis and then slowly relaxed so that the initial magnetic state was primarily in the −x direction. For consistency each simulated structure was started from the same initial magnetic state. A magnetic field was applied along the long axis of the wire (+x-axis) to inject a head to head domain wall along with a bias field applied along the y-axis to control the direction of the magnetic moments in the domain wall. The external fields were applied at time zero, and a wall was considered to be injected if it was in the wire after 2 ns. The typical injection time was under a nanosecond and we never found a case where it was likely that running the simulation longer would result in an injection.

Figure 9:
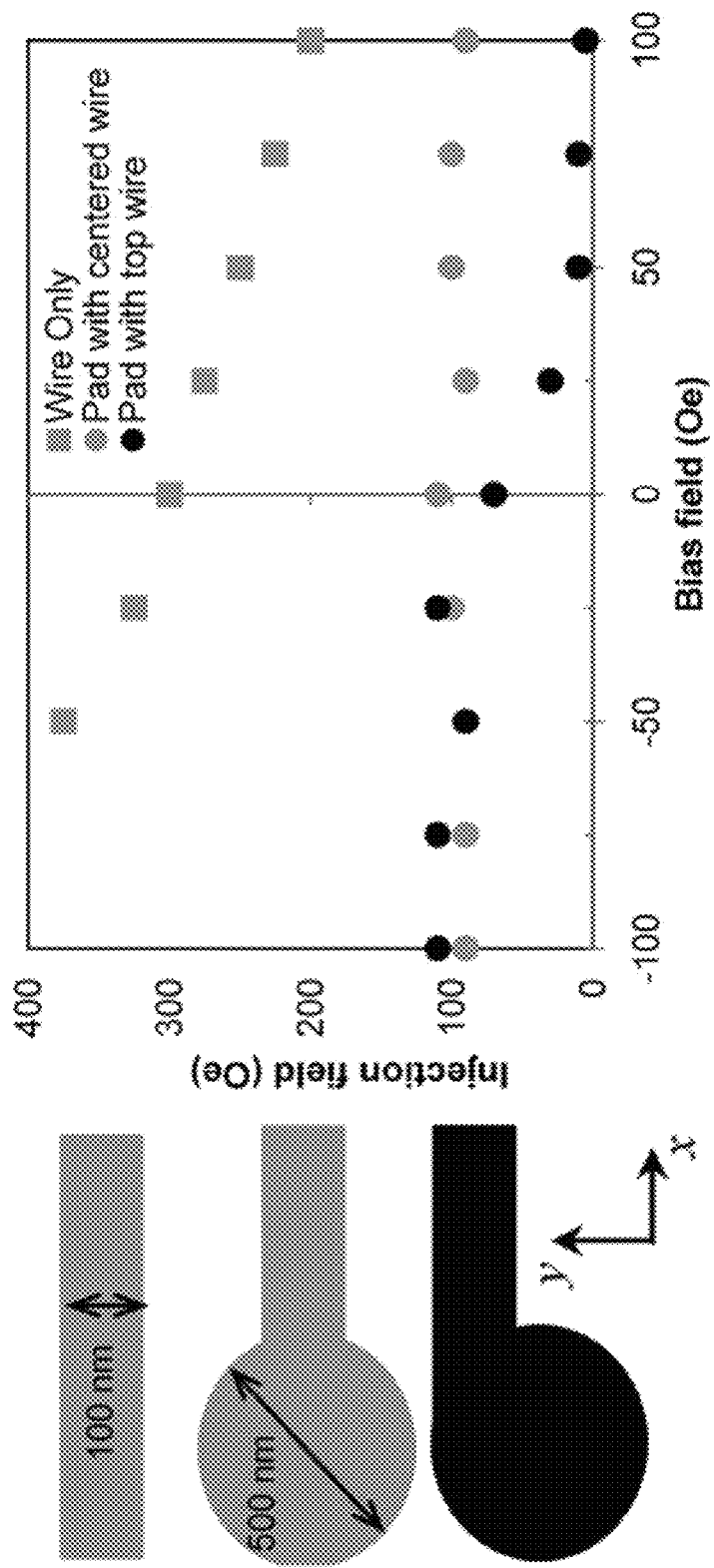
FIG. 9. Injection fields (x-dir) as a function of bias field (y-dir) for three injection geometries into a 100×5 nm$^2$ wire. The injection field is decreased for small positive bias fields when the wire is moved to the top edge of the injection pad.

In a thin, narrow nanowire the strong shape anisotropy determines that the magnetic moments lie in the plane of the wire and are oriented along the long axis. The simplest transition between domains is a transverse wall that separates two head-to-head or tail-to-tail domains[9]. In a long, straight wire a domain wall can be injected into with a large magnetic field. In FIG. 9 the injection field is found to be over 200 Oe for a 100×5 nm$^2$ wire. The injection field depends on the dimensions of the wire and the bias field, but even as the dimensions are increased the injection field is much greater than the Walker field. To decrease the injection field it is possible to use an injection pad, which is essentially a large magnetic region attached at one end of the wire. The pad is typically located with the wire at the center[10-12]. The inclusion of a 500 nm diameter disk decreases the injection field to around 100 Oe. As FIG. 9 shows the injection field is found to be independent of the bias field, used to inject domain walls of a known chirality, when the wire is located at the center of the disk. Moving the wire to the top or bottom edge of the disk leads to a sharp reduction in the injection field for reasonable bias fields. As shown in FIG. 9, when the wire is located at the top of the disk, bias fields greater than 50 Oe in the +y-direction lower the injection field to as little as 5 Oe. This field is less than the critical Walker field resulting in the fastest, most reliable domain wall motion. Interestingly, the injection field is not symmetric for negative bias fields. There is a strong dependence on the direction of the bias field when the wire is located at an edge. This implies that the injection structures geometry preferentially selects a domain wall orientation. This behavior is confirmed by moving the wire to the bottom edge of the disk. In this case the behavior is reversed; the injection field is small for negative bias fields and large for positive bias fields. The topological structure of a domain wall can be used to explain the selectivity.

Figure 10:
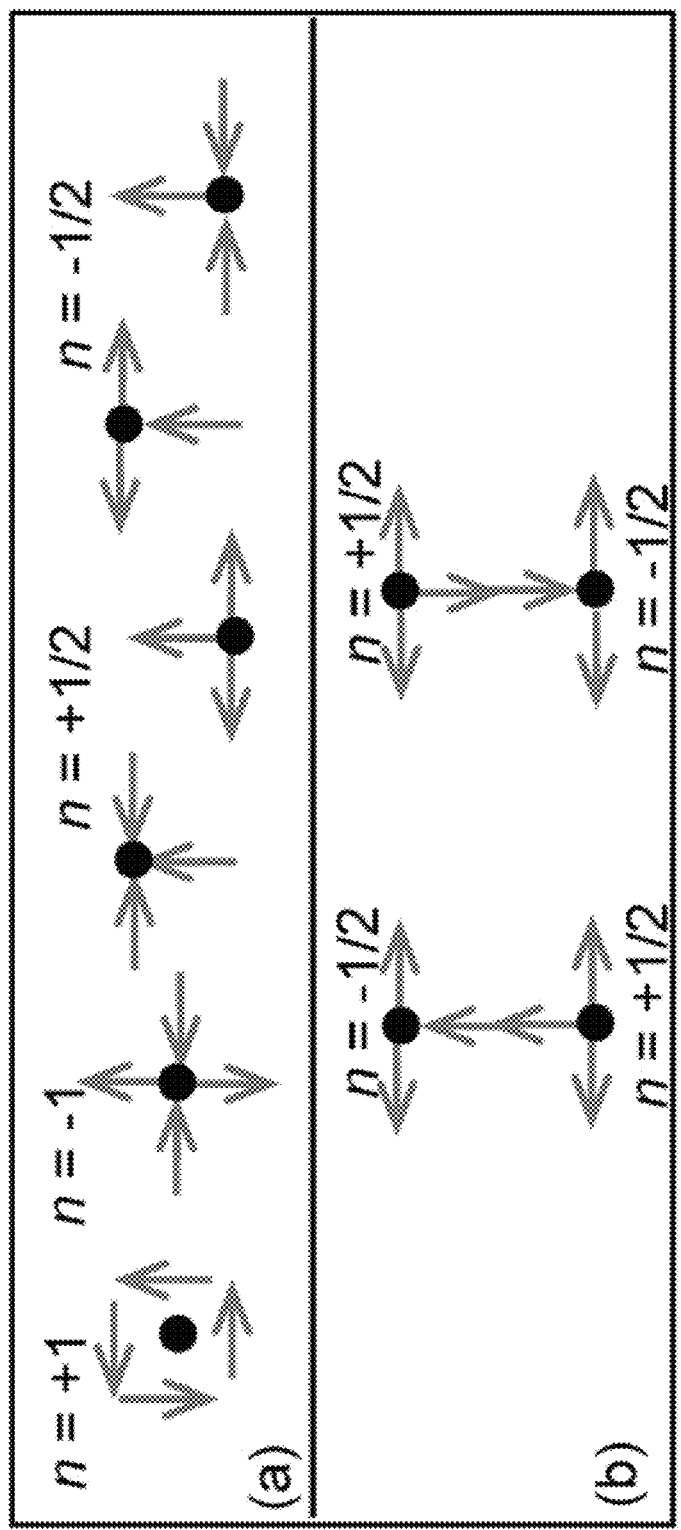
FIG. 10. (a) Cartoon representations of the magnetic structure for two-dimensional topologic defects with their winding numbers n. Edge defects have half-integer winding numbers.

Moving the wire from the center of the injection disk to the top reduces the number of potential domain wall pinning sites from two to one. However, FIG. 1 shows that the injection field is essentially the same without a bias field (and for negative bias fields) for the two disk structures. This behavior implies that a reduction in the overall potential pinning sites is not responsible for the lower injection field but that the pinning mechanism itself is important. Domain wall pinning is a rich topic of current interest due to its importance in reliably moving walls through wires and domain walls can be pinned by both notches and anti-notches[10,12,13-15]. A topologic model of a domain wall may be used to explain the injection mechanism. A domain wall can be considered a topological object consisting of two or more defects[16]. In a two-dimensional structure, like a thin wire, the typical defects can be described by a winding number, with a vortex having a winding number of n=+1 and an anti-vortex of n=−1 as shown in FIG. 10a. When defects are found along the edge of a wire the winding numbers are half-integer structures of which several orientations are presented in FIG. 10a. A domain wall is a composite object of zero net winding number, and domain wall orientations for a simple transverse wall are presented in FIG. 10b.

A simulated time lapse sequence of the injection of a domain wall into a wire is presented in FIG. 11a. Along the top edge of the system, the winding number is positive but along the bottom edge it is negative. The domain wall injects in about 700 ps. In FIG. 11b,c cartoon representations of the four possible transverse domain orientations are presented. When the winding number of the defect along the edge of the system with no pinning sites is positive, the wall easily injects, otherwise it is pinned. The positive defect always was observed to be pinned. This behavior of the positive defect being pinned is consistent with the behavior noticed in anti-notches where negative defects are pinned by notches[13, 15].

When the wire is located in the center of the pad, a positive defect must always pass a pinning site to enter the wire, independent of the domain wall chirality. By moving the wire to the top of the injection pad a bias field can be used to arrange the location of the positive defect. This eliminates the domain wall pinning site and the wall quickly injects. The dependence on the strength of the bias field is due to the ease of rotating the magnetization of the nanopad. While the bias field rotates the magnetization of the pad and leaves the magnetic state of the wire unaffected, larger bias fields do a more effective job of aligning the magnetization of the pad as shown in FIG. 11a. The bias field essentially places the domain wall at the injection site and the wall is easily pushed into the wire by the injecting field. A 50 Oe field is sufficient to cause the magnetization of the small disk to essentially saturate. Smaller bias fields are not strong enough to position the wall directly at the end of the wire. A larger injection field is needed.

It is possible to inject domain walls with small magnetic fields using a "L" shaped bend in a long wire[6, 15], and this technique is useful for studying single domain walls. However, "L" geometry only allows for a single domain wall to be in the wire. For nanowire devices to be viable in industry, it will be necessary to inject multiple walls and to control their magnetic structure[1]. The disk structure presented here is capable of achieving this behavior. After the domain wall is injected into the wire, the fields quickly drive the wall along the length of the wire. Because the injection field is less than the critical Walker field the domain wall maintains its orientation at all times. It is now possible to inject a second domain wall into the wire by reversing both the bias field and the injection field. The field reversal keeps the winding number of the top defect positive as shown in the cartoon of FIG. 11b and a second domain wall quickly is injected. This process can be repeated to inject multiple domain walls into the wire. The simulated injection of three domain walls into a 50×5 nm$^2$ wire is presented in FIG. 12. The equilibrium domain structure demonstrates the potential to pack many domain walls in a small length of wire. Control of the topological defects allows the domain walls to remain in the wire when the walls collide[16, 17].

In conclusion, a nanodisk is used as a domain wall injector for a magnetic nanowire. When the wire is located at the edge of the nanodisk the domain walls inject quickly with small fields and a known domain wall orientation. A bias field is used to control the domain wall magnetization but the geometry selects which chirality of domain wall to inject. A simple model using the topological nature of a domain wall was presented to show that controlling the positive defect is necessary to easily inject a domain wall. Control of the injected domain walls leads to a simple method to inject and densely pack multiple walls into a wire.

References for Example 2

1. S. S. Parkin, M. Hayashi and L. Thomas, Science 320, 190-194 (2008).
2. D. A. Allwood, G. Xiong, C. C. Faulkner, D. Atkinson, D. Petit and R. P. Cowburn, Science 309, 1688-1692 (2005).
3. A. Kunz and S. C. Reiff, Appl. Phys. Lett. 93 082503-1 to -3 (2008).
4. J -Y Lee, K -S Lee, S. Choi, K. Y. Guslienko and S -K Kim, Phys. Rev. B 76 184408 (2007).
5. A. Vanhaverbeke, A. Bischof and R. Allenspach, Phys. Rev. Lett. 101, 107202 (2008).
6. E. R. Lewis, D. Petit, A -V Jausovec, L. O'Brien, D. E. Read, H. T. Zeng, and R. P. Cowburn, Phys. Rev. Lett. 102, 057209 (2009).
7. N. L. Schryer and L. R. Walker, J. Appl. Phys. 45(12) 5406 (1974).
8. LLG Micromagnetic Simulator, v2.61, 2007.
9. R. D. McMichael and M. J. Donahue, IEEE Trans. Magn. 33(5), 4167 (1997).
10. C. C. Faulker, D. A. Allwood and R. P. Cowburn, J. Appl. Phys. 103, 073914 (2008).
11. K. Weerts, P. Neutens, L. Lagae and G. Borghs, J. Appl. Phys. 103, 094307 (2008).
12. D. Atkinson, D. S. Eastwood, and L. K. Bogart, Appl. Phys. Lett. 92, 022510 (2008).
13. M. Hayashi, L. Thomas, C. Renner, R. Moriya, X. Jiang and S. S. P. Parkin, Phys. Rev. Lett. 97, 207205 (2006).
14. L. K. Bogart, D. Atkinson, K. O'Shea, D. McGrouther and S. McVitie, Phys. Rev. B 79, 054415 (2009).
15. D. Petit, A -V Jausovec, D. Read and R. P. Cowburn, J. Appl. Phys. 103, 114307 (2008).
16. O. Tchernyshyov and G -W. Chern, Phys. Rev. Lett. 95, 197204 (2005).
17. J -G Zhu and Y. Zheng. "The Micromagnetics of Magnetoresistive Random Access Memory". Spin Dynamics in Confined Magnetic Structures I. B. Hillebrands and K. Ounadjela (Eds.). Springer-Verlag (Berlin Heidelberg 2002).

It will be readily apparent to one skilled in the art that varying substitutions and modifications may be made to the invention disclosed herein without departing from the scope and spirit of the invention. The invention illustratively described herein suitably may be practiced in the absence of any element or elements, limitation or limitations which is not specifically disclosed herein. The terms and expressions which have been employed are used as terms of description and not of limitation, and there is no intention in the use of such terms and expressions of excluding any equivalents of the features shown and described or portions thereof, but it is recognized that various modifications are possible within the scope of the invention. Thus, it should be understood that although the present invention has been illustrated by specific embodiments and optional features, modification and/or variation of the concepts herein disclosed may be resorted to by those skilled in the art, and that such modifications and variations are considered to be within the scope of this invention.

Citations to a number of patent and non-patent references are made herein. The cited references are incorporated by reference herein in their entireties. In the event that there is an inconsistency between a definition of a term in the specification as compared to a definition of the term in a cited reference, the term should be interpreted based on the definition in the specification.

The invention claimed is:

1. A magnetic storage device comprising:
   (a) an injection pad, wherein the injection pad is circular; and
   (b) a nanowire extending from the injection pad, wherein the nanowire has an outer edge that extends tangentially and linearly along an X-axis from an outer curved edge of the injection pad;
   wherein:
      the injection pad and nanowire comprise magnetic metal material and are monolithic;
      the nanowire has a top width of 20-200 nm extending along a Y-axis perpendicular to the X-axis;

the injection pad has a top surface area parallel to a plane defined by the X-axis and the Y-axis of $3\times10^4$–$8\times10^5$ nm$^2$); and the injection pad and nanowire have a thickness of 1-50 nm along a Z-axis perpendicular to the X-axis and the Y-axis.

2. The device of claim 1, wherein the magnetic metal material comprises iron, nickel, cobalt, or an alloy thereof.

3. The device of claim 1, wherein the magnetic metal material comprises an iron alloy.

4. The device of claim 3, wherein the iron alloy is an iron-nickel alloy.

5. The device of claim 4, wherein the iron-nickel alloy is permalloy.

6. The device of claim 1, wherein the nanowire has a top width of 50-100 nm.

7. The device of claim 1, wherein the nanowire has a length extending from the outer edge of the injection pad of at least about 200 nm.

8. The device of claim 1, wherein the nanowire has a length extending from the outer edge of the injection pad of at least about 1000 nm.

9. The device of claim 1, wherein the injection pad has a diameter of 200-1000 nm.

10. The device of claim 1, wherein the injection pad and nanowire have a thickness of 1-10 nm.

11. The device of claim 1, further comprising one or more notches in the Nanowire.

12. The device of claim 1, further comprising non-magnetic material positioned at the end of the nanowire opposite the injection pad.

13. The device of claim 1, wherein the outer curved edge of the injection pad and the outer edge of the nanowire are at least partially coincident.

14. The device of claim 1, wherein the outer edge of the nanowire extends tangentially and linearly along the X-axis from the outer cured edge of the injection pad without bending.

* * * * *